(12) United States Patent
Fukushima

(10) Patent No.: US 7,105,256 B2
(45) Date of Patent: Sep. 12, 2006

(54) PHOTOSENSITIVE CONDUCTIVE COMPOSITION AND PLASMA DISPLAY PANEL FORMED BY USING THE SAME

(75) Inventor: Kazunobu Fukushima, Saitama (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 26 days.

(21) Appl. No.: 10/922,937

(22) Filed: Aug. 23, 2004

(65) Prior Publication Data

US 2005/0089794 A1  Apr. 28, 2005

(30) Foreign Application Priority Data

Aug. 21, 2003  (JP)  ............................. 2003-208269

(51) Int. Cl.
- G03F 7/028 (2006.01)
- G03F 7/033 (2006.01)
- G03F 7/28 (2006.01)
- G03F 7/40 (2006.01)

(52) U.S. Cl. ............ 430/9; 430/281.1; 430/311; 430/905; 430/910; 430/198; 522/81

(58) Field of Classification Search ........ 430/198, 430/9, 281.1, 311, 905, 910; 522/81
See application file for complete search history.

(56) References Cited

U.S. PATENT DOCUMENTS 5,972,564 A * 10/1999 Kawana et al. .......... 430/281.1
6,342,322 B1 * 1/2002 Kakinuma et al. ............ 430/17
2003/0087170 A1 * 5/2003 Glicksman et al. ........... 430/18

FOREIGN PATENT DOCUMENTS

| EP | 1008909 | * | 6/2000 |
|---|---|---|---|
| JP | 5-67405 | | 3/1993 |
| JP | 5-271576 | | 10/1993 |
| JP | 08-227153 | | 9/1996 |
| JP | 8-325602 | | 12/1996 |
| JP | 9-142878 | | 6/1997 |
| JP | 10-269848 | | 10/1998 |
| JP | 11-066957 | | 3/1999 |
| JP | 11-339554 | | 12/1999 |
| JP | 2000-305260 | | 11/2000 |
| JP | WO 01/04705 | | 1/2001 |
| JP | 2001-216839 | | 8/2001 |
| JP | 2001-226596 | | 8/2001 |
| JP | 2002-26528 | | 1/2002 |
| JP | 2003-043676 | | 2/2003 |
| JP | 2004-29839 | | 1/2004 |
| JP | 2004-126573 | | 4/2004 |

* cited by examiner

Primary Examiner—Richard L. Schilling
(74) Attorney, Agent, or Firm—Oblon, Spivak, McClelland, Maier & Neustadt, P.C.

(57) ABSTRACT

A photosensitive conductive composition including a silver powder having an X-ray diffraction pattern in which a half width of a silver (111) peak is at least about 0.15°, an organic binder, a photopolymerizable monomer, a photopolymerization initiator and a lead-free glass.

19 Claims, 2 Drawing Sheets

PHOTOSENSITIVE CONDUCTIVE COMPOSITION AND PLASMA DISPLAY PANEL FORMED BY USING THE SAME

CROSS-REFERENCE TO RELATED APPLICATIONS

The present application claims priority to Japanese Patent Application No. 2003-208269, filed Aug. 21, 2003. The contents of this application are incorporated herein by reference in its entirety.

BACKGROUND OF THE INVENTION

1. Field of the Invention

The present invention relates to a photosensitive conductive composition, a plasma display panel including a patterned conductor formed by using the photosensitive conductive composition, a conductor formed by using the photosensitive conductive composition, and a method of forming a conductor on a substrate.

2. Discussion of the Background

One of the methods for forming an electrode on a substrate is vapor deposition which deposits a gold film on a member placed in a vacuum vessel. Another method for forming a conductor pattern layer on a substrate includes patterning a paste material containing a non-photosensitive organic binder and a metal powder, e.g., a drying or thermosetting conductive paste, on a substrate by a printing technique such as screen printing.

U.S. Pat. No. 5,972,564 discloses a method of forming a conductor on a substrate through photolithography using an alkali development type photocurable conductive paste composition. The contents of this publication are incorporated herein by reference in its entirety.

SUMMARY OF THE INVENTION

According to one aspect of the present invention, a photosensitive conductive composition includes a silver powder having an X-ray diffraction pattern in which a half width of a silver (111) peak is at least about 0.15°, an organic binder, a photopolymerizable monomer, a photopolymerization initiator and a lead-free glass.

According to another aspect of the present invention, a plasma display panel includes a patterned conductor formed by firing a photosensitive conductive composition, and the photosensitive conductive composition includes a silver powder having an X-ray diffraction pattern in which a half width of a silver (111) peak is at least about 0.15°, an organic binder, a photopolymerizable monomer, a photopolymerization initiator, and a lead-free glass.

According to yet another aspect of the present invention, a conductor includes a fired material, and the fired material is formed by firing a photosensitive conductive composition including a silver powder having an X-ray diffraction pattern in which a half width of a silver (111) peak is at least about 0.15°, an organic binder, a photopolymerizable monomer, a photopolymerization initiator, and a lead-free glass.

According to yet another aspect of the present invention, a method of forming a patterned conductor on a substrate includes providing on a substrate a photosensitive conductive composition including a silver powder having an X-ray diffraction pattern in which a half width of a silver (111) peak is at least about 0.15°, an organic binder, a photopolymerizable monomer, a photopolymerization initiator, and a lead-free glass, subjecting the photosensitive conductive composition to a patterned exposure of light, developing the photosensitive conductive composition to form a patterned composition, and firing the patterned composition at a predetermined temperature.

According to yet another aspect of the present invention, a plasma display panel includes a patterned conductor produced by a process including providing on a substrate a photosensitive conductive composition including a silver powder having an X-ray diffraction pattern in which a half width of a silver (111) peak is at least about 0.15°, an organic binder, a photopolymerizable monomer, a photopolymerization initiator, and a lead-free glass, subjecting the photosensitive conductive composition to a patterned exposure of light, developing the photosensitive conductive composition to form a patterned composition, and firing the patterned composition.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
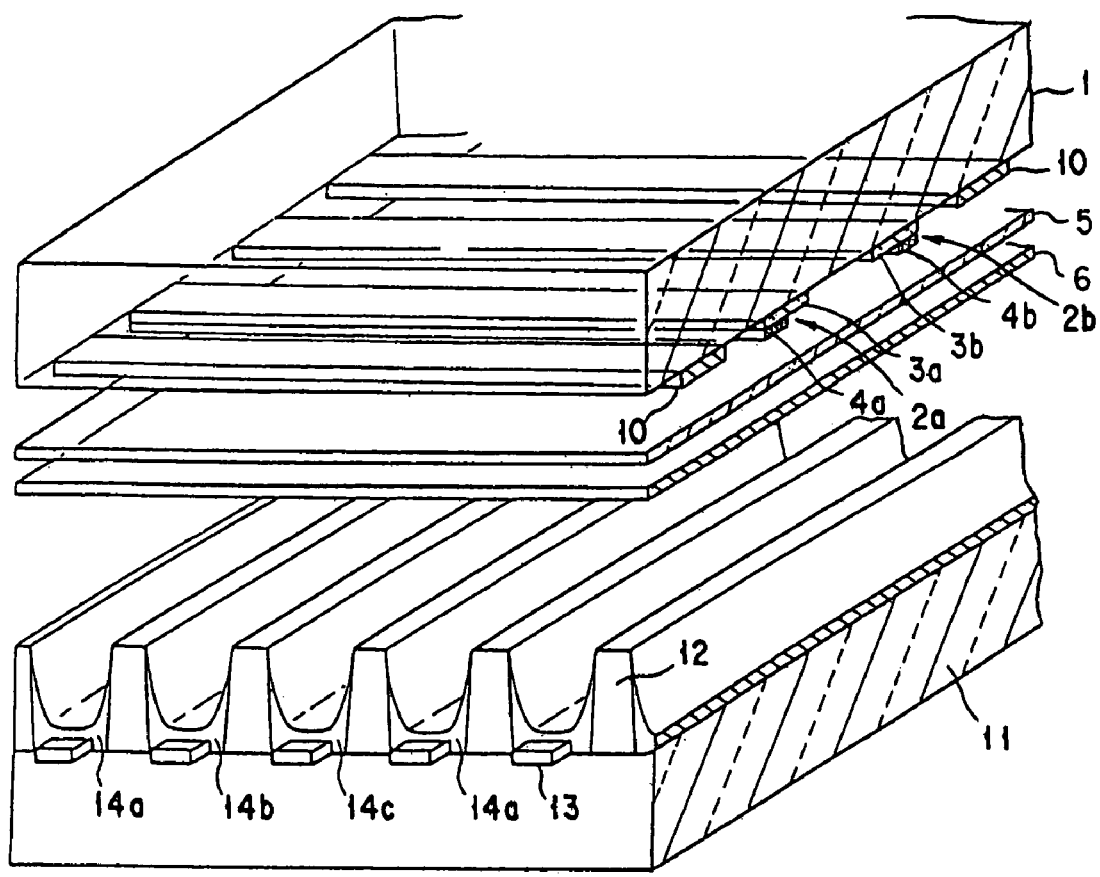
FIG. 1 is a schematic illustration showing a structure of a plasma display panel including a patterned conductor formed by using a photosensitive conductive composition according to one embodiment of the present invention.

The embodiments will now be described with reference to the accompanying drawings, wherein like reference numerals designate corresponding or identical elements throughout the various drawings.

FIG. 1 is a schematic illustration of a plasma display panel including a front glass substrate 1, display electrodes 2a and 2b, transparent electrodes 3a and 3b, bus electrodes 4a and 4b, a dielectric layer 5, a protective layer 6, a black matrix 10, a rear glass substrate 11, ribs 12, address electrodes 13, and fluorescent films 14a–14c. In order to form the conductor pattern on the substrate as shown in FIG. 1, a conductive composition is first provided on a substrate, dried to form a film, subjected to pattern exposure and development, and then fired at a predetermined temperature to remove an organic binder in the conductive composition. When the conductor pattern is formed on a glass substrate, firing is preferably performed at a temperature of about 620° C. or less, for example, at a temperature of from about 480° C. to about 620° C., so as to avoid glass deformation, and it is desired that a sufficient conductivity is obtained even in the firing at such a low temperature.

A photosensitive conductive composition according to one embodiment of the present invention includes a silver powder (A) having relatively low crystallinity, an organic binder (B), a photopolymerizable monomer (C), a photopolymerization initiator (D), and a lead-free glass powder (E).

Silver is a relatively inexpensive noble metal and can be fired without being affected by oxidation, and is thus preferably used in firing in an air atmosphere. Also, sufficient sinterability of the silver powder for firing at a lower temperature of about 620° C. or less is achieved by using a silver powder having relatively low crystallinity, in particular, a silver powder showing an Ag (111) peak with a half width of about 0.15° or more in an X-ray diffraction pattern, without decreasing the particle size of the silver powder. This technique used in this embodiment of the present invention, i.e., adjusting the crystallinity of the silver powder so as to obtain sufficient sinterability for firing at a temperature of about 620° C. or less, is preferred to other methods for increasing the sinterability, which decrease the particle size of the conductive powder or utilize a conductive flake powder, because in those other methods, it is more difficult to form a high-definition conductor pattern because of low light transmittance. The photosensitive conductive composition according to this embodiment of the present invention can be sufficiently fired at a lower firing temperature and provides a conductor having a high-definition pattern and excellent conductivity.

As the silver powder (A) for imparting conductivity to a paste, silver powders having relatively low crystallinity are preferred, and more specifically, silver powders having an X-ray diffraction pattern in which the Ag (111) peak has a half width of at least about 0.15° or at least about 0.19° are preferable. When a silver powder showing a half-width of less than about 0.15° is used, sintering between the particles may not proceed sufficiently because of the high crystallinity of the silver powder, and thus the resistance may not be decreased in firing at a temperature of about 620° C. or less. When the half-width exceeds about 1.0°, binding between the particles may proceed excessively because of the considerably low crystallinity of the silver powder, and irregular winding or deflection of a line in the conductor pattern may occur. Thus, the Ag (111) peak half-width of the silver powder (A) is preferably about 1.0° or less.

The half-width of the Ag (111) peak is determined from an X-ray diffraction pattern measured by using an X-ray analyzer RINT-1500 (produced by Rigaku Industrial Corporation) and Cu as an X-ray target under the analytical conditions of 50 kV and 200 mA. The silver powder (A) is generally produced by a method such as atomization or chemical reduction. The atomization method includes spraying melted silver with a fluid such as gas or water to produce a silver powder, and this method can easily produce spherical particles and has excellent mass productivity. The chemical reduction method includes chemically-reacting a water-soluble silver salt with a reducer to produce a silver powder. Specifically, in this method, a silver nitrate used as the water-soluble silver salt is reacted with a base such as a caustic alkali, an ammonium salt, or hydrazine used as the reducer to precipitate metallic silver, and then the resultant silver slurry is washed with water and dried to produce a silver powder.

As to the shape of the silver powder (A), the spherical shape is preferred in view of optical characteristics and dispersibility.

The silver powder (A) preferably has an average particle size of about 0.1 μm to about 5 μm or about 0.4 μm to about 2.0 μm, of ten silver particles randomly selected in observation under a scanning electron microscope (SEM) with about 10,000 times magnification. When the average particle size is less than about 0.11 μm, light transmittance may become worse to make it more difficult to form a high-definition pattern. When the average particle size exceeds about 5 μm, linearity of a line edge may become hard to obtain. The average particle size measured by a microtrack is preferably about 0.5 μm to about 3.5 μm.

The silver powder (A) preferably has a specific surface area of about 0.01 $m^2$/g to about 2.0 $m^2$/g or about 0.1 $m^2$/g to about 1.0 $m^2$/g. When the specific surface area is less than about 0.01 $m^2$/g, sedimentation may occur in preservation. When the specific surface area exceeds about 2.0 $m^2$/g, an oil absorption increases, and thus the fluidity of the paste may be degraded. The specific surface area is measured by a single-point BET method according to JIS R 1626.

The amount of the silver powder (A) is preferably about 50 parts by weight to about 90 parts by weight in 100 parts of the photosensitive conductive composition by weight. When the amount of the conductive powder mixed is less than the above range, sufficient conductivity may not be imparted to the conductor pattern formed by using the paste. When the amount of the conductive powder mixed exceeds the above range, adhesion to the substrate may be impaired.

The photosensitive conductive composition according to this embodiment of the present invention includes an organic binder (B) for binding components before firing and/or for imparting photocurability and development performance to the composition. As the organic binder (B), a resin having carboxyl groups, e.g., either a carboxyl-containing photosensitive resin having an ethylenic unsaturated double bond or a carboxyl-containing resin having no ethylenic unsaturated double bond, may be used. Preferred examples of such a resin (which may be either an oligomer or a polymer) include the following resins:

(1) A carboxyl-containing resin produced by copolymerization of an unsaturated carboxylic acid (a) and a compound (b) having an unsaturated double bond;

(2) A carboxyl-containing photosensitive resin produced by adding a pendant ethylenic unsaturated group to a copolymer of an unsaturated carboxylic acid (a) and a compound (b) having an unsaturated double bond;

(3) A carboxyl-containing resin produced by reacting a copolymer of an acid anhydride (e) having an unsaturated double bond and a compound (b) having an unsaturated double bond with a hydroxyl-containing compound (f);

(4) A carboxyl-containing photosensitive resin produced by reacting a copolymer of an acid anhydride (e) having an unsaturated double bond and a compound (b) having an unsaturated double bond with a hydroxyl-containing compound (g) having an unsaturated double bond;

(5) A carboxyl-containing photosensitive resin produced by reacting a secondary hydroxyl group produced by reaction between a polyfunctional epoxy compound (h) and an unsaturated monocarboxylic acid (i) with a polybasic acid anhydride (d);

(6) A carboxyl-containing resin produced by reacting the epoxy groups of a copolymer of a compound (b) having an unsaturated double bond and a glycidyl (meth)acrylate with an organic acid (j) having one carboxyl group in its molecule and no ethylenic unsaturated bond, and further reacting the produced secondary hydroxyl groups with a polybasic acid anhydride (d);

(7) A carboxyl-containing resin produced by reacting a hydroxyl-containing polymer (k) with a polybasic acid anhydride (d); and (8) A carboxyl-containing photosensitive resin produced by reacting a carboxyl-containing resin produced by reaction between a hydroxyl-containing polymer (k) and a polybasic acid anhydride (d) with a compound (c) having an epoxy group and an unsaturated double bond.

These carboxyl-containing photosensitive resins and carboxyl-containing resins may be used alone or in a mixture. However, in either of the cases, the total amount of the resins is preferably about 5% by weight to about 50% by weight of the composition. When the amount of the resins is excessively smaller than the above range, the distribution of the resins contained in the formed film may be made non-uniform, and thus sufficient photocurability and depth of photocuring may not be obtained, and pattering by selective exposure and development may become harder. When the amount is excessively larger than the above range, deflection of the pattern or shrinkage of a line may occur during firing.

Each of the carboxyl-containing photosensitive resin and the carboxyl-containing resin preferably has a weight-average molecular weight of about 1,000 to about 100,000 or about 5,000 to about 70,000, and an acid value of about 30 mgKOH/g to about 250 mgKOH/g. The carboxyl-containing photosensitive resin preferably has a double bond equivalent of about 350 to about 2,000, or about 400 to about 1,500.

When each of the resins has a molecular weight of less than about 1,000, the adhesion of the film during development may be adversely affected. When each of the resins has a molecular weight of over about 100,000, a development defect may occur. When the acid value is less than about 30 mgKOH/g, solubility in an aqueous alkali solution may be insufficient, and a development defect may occur. When the acid value is over about 250 mgKOH/g, deterioration in adhesion of the film or dissolution of a photocured portion (exposed portion) may occur during development. Furthermore, when the carboxyl-containing photosensitive resin has a double bond equivalent of less than about 350, a residue may remain after firing. When the double bond equivalent exceeds about 2,000, the development work will have a narrow margin, and a high exposure may be required for photocuring.

The photosensitive conductive composition according to this embodiment of the present invention includes a photopolymerizable monomer (C) for imparting and improving photocurability of the composition and for improving development performance. Examples of the photopolymerizable monomer (C) include acrylates such as 2-hydroxyethyl acrylate, 2-hydroxypropyl acrylate, diethylene glycol diacrylate, triethylene glycol diacrylate, polyethylene glycol diacrylate, polyurethane diacrylate, trimethylolpropane triacrylate, pentaerythritol triacrylate, pentaerythritol tetraacrylate, triacrylate of ethylene oxide-modified trimethylolpropane, triacrylate of propylene oxide-modified trimethylolpropane, dipentaerythritol pentaacrylate, and dipentaerythritol hexaacrylate; methacrylates corresponding to the respective acrylates; and mono-, di-, tri-, or higher valent polyesters of polybasic acids such as phthalic acid, adipic acid, maleic acid, itaconic acid, succinic acid, trimellitic acid, and terephthalic acid with hydroxyalkyl (meth) acrylates. However, the photopolymerizable monomer (C) is not particularly limited, and these examples may be used alone or in combination. Among these photopolymerizable monomers, polyfunctional monomers each having at least two acryloyl groups or methacryloyl groups per molecule are preferred.

The amount of the photopolymerizable monomer (C) is preferably about 20 parts by weight to about 100 parts by weight on the basis of about 100 parts of the organic binder (B) by weight. When the amount of the photopolymerizable monomer (C) is less than the above range, sufficient photocurability of the composition may be hard to attain. When the amount of the photopolymerizable monomer (C) exceeds the above range, the rate of photocuring in a surface layer becomes higher than that in a deep portion of the film, which may cause uneven curing.

The photosensitive conductive composition according to this embodiment of the present invention includes a photopolymerization initiator (D) for initiating photoreaction and for mainly absorbing ultraviolet light to produce radicals. Examples of the photopolymerization initiator (D) include benzoin and benzoin alkyl ethers such as benzoin methyl ether, benzoin ethyl ether, and benzoin isopropyl ether; acetophenones such as acetophenone, 2,2-dimethoxy-2-phenylacetophenone, 2,2-diethoxy-2-phenylacetophenone, and 1,1-dichloroacetophenone; aminoacetophenones such as 2-methyl-1-[4-(methylthio)phenyl]-2-morpholinopropanone-1,2-benzyl-2-dimethylamino-1-(4-morpholinophenyl)-butanone-1; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, isopropylthioxanthone, and 2,4-diisopropylthioxanthone; ketals such as acetophenone dimethylketal and benzyl dimethylketal; benzophenones such as benzophenone; xanthones; phosphine oxides such as (2,6-dimethoxybenzoyl)-2,4,4-pentylphosphine oxide, bis(2,4,6-trimethylbenzoyl)-phenylphosphine oxide, 2,4,6-trimethylbenzoyl diphenylphosphine oxide, and ethyl-2,4,6-trimethylbenzoyl phenylphosphinate; and various peroxides. However, the initiator is not particularly limited, and these examples may be used alone or in combination.

The desired amount of the photopolymerization initiator (D) in the composition is 1 part by weight to about 30 parts by weight or about 5 parts by weight to about 20 parts by weight, on the basis of 100 parts by weight of the organic binder (B). When the amount of the initiator is less than the above range, sufficient photocurability of the photosensitive conductive composition may not be attained. When the amount of the initiator exceeds the above range, light transmittance is inhibited, and thus satisfactory photocurability in a deep portion may become hard to obtain.

The photosensitive conductive composition according to this embodiment of the present invention includes a lead-free glass powder (E) having a low-melting-point glass composition which does not contain PbO. A low-melting-point glass powder is preferably used in order to increase adhesion of a fired film to a substrate and the strength of the film. The use of the low-melting-point lead-free glass powder (E) can provide a conductor pattern having sufficient adhesion and strength by firing at about 620° C. or less while improving the working environment and preventing lead contamination due to waste. Also, since harmful PbO is not contained, the cost required for working environmental control and waste disposal is decreased.

Therefore, according to the present embodiment, the lead-free glass powder (E) which includes a glass composition not containing PbO and which can achieve sufficient adhesion to a substrate and sufficient strength even by firing at about 620° C. or less without causing deformation of substrate glass is desirably used as a glass powder of a photosensitive conductive composition used for forming a patterned conductor of a plasma display panel or other conductors.

The lead-free glass powder (E) is preferably a low-melting-point lead-free glass powder having a glass transition point (Tg) of from about 300° C. to about 500° C. and a softening point (Ts) of from about 400° C. to about 600° C. When the Tg is lower than about 300° C., and the softening point is lower than about 400° C., melting occurs at a temperature lower than the temperature of binder removal, which may cause enveloping the organic binder, and the remaining organic binder may be decomposed to produce a blister in the composition. When the Tg exceeds about 500° C. and the softening point exceeds about 600° C., sufficient adhesion to the substrate may not be obtained by firing at a temperature of about 620° C. or less.

The glass composition for the lead-free glass powder (E) is the composition which does not contain PbO and is preferably an alkali glass composition, a phosphorus-based glass composition, or a bismuth-based glass composition.

The alkali glass composition preferably contains at least one component (referred to as an "alkali component" hereinafter) selected from the group consisting of $Li_2O$, $Na_2O$, $K_2O$, CaO, BaO, and MgO at a content of about 5% by weight to about 50% by weight (a total content when two or more alkali components are included) of the amount of the glass composition. An example of such an alkali glass composition is the composition which contains about 5% by weight to about 50% by weight of at least one alkali component, about 1% by weight to about 15% by weight of $Al_2O_3$, and about 10% by weight to about 75% by weight of $SiO_2$.

The phosphorus-based glass composition for the lead-free glass powder (E) preferably contains $P_2O_5$ at a content of about 30% by weight to about 80% by weight of the glass composition. An example of such a phosphorus-based glass composition is the composition which contains about 30% by weight to about 80% by weight of $P_2O_5$, 1% by weight to about 20% by weight of BaO, about 1% by weight to 15% by weight of $Al_2O_3$, and about 1% by weight to about 30% by weight of ZnO.

The bismuth-based glass composition for the lead-free glass powder (E) preferably contains $Bi_2O_3$ at a content of about 30% by weight to about 80% by weight of the glass composition. An example of such a bismuth-based glass composition is the composition which contains about 30% by weight to about 80% by weight of $Bi_2O_3$, about 5% by weight to about 30% by weight of BaO, about 5% by weight to about 30% by weight of $B_2O_3$, and about 5% by weight to about 30% by weight of ZnO.

According to the present embodiment, the content of the lead-free glass powder (E) in the composition is preferably about 1 part by weight to about 30 parts by weight or about 2 parts by weight to about 15 parts by weight, on the basis of 100 parts by weight of the silver powder (A) of the present embodiment. When the content of the lead-free glass powder (E) is less than about 1 part by weight, sufficient adhesion to the substrate may not be obtained, and when the content exceeds about 30 parts by weight, the conductivity of the composition may decrease.

For achieving improved resolution, the lead-free glass powder (E) preferably has a particle size of about 10 μm or less, and may be either crystalline or amorphous.

When a larger photocuring depth is desired, the photosensitive conductive composition of the present embodiment may be used in combination with a curing aid such as a titanocene-type photopolymerization initiator, e.g., Irgacure 784 produced by Ciba Specialty Chemicals Co., Ltd. which initiates radical polymerization in the visible light region, and a leuco dye, depending on the needs.

Furthermore, if desired, the photosensitive conductive composition of the present embodiment may be used together with other additives such as an acid compound for securing preservative stability, e.g., a phosphoric acid, a phosphoric acid ester, or a carboxylic acid-containing compound, a silicone-type or acrylic-type defoaming and leveling agent, a thixotropic agent for controlling fluidity, and a silane coupling agent for improving film adhesion. Other materials which may be added as appropriate are, for example, a general-use antioxidant for preventing oxidation of the conductive metal powder, a thermopolymerization inhibitor for improving thermal stability in preservation, and fine particles of a metal oxide, a silicon oxide or boron oxide, for bonding to the substrate during firing. Also, an inorganic powder of silica, bismuth oxide, aluminum oxide, or titanium oxide, an organometallic compound, a metal salt of an organic acid, or a metal alkoxide may be added for controlling firing shrinkage.

Furthermore, in order to control a color tone, a black pigment including a metal oxide or composite metal oxide containing at least one of Fe, Co, Cu, Cr, Mn, Al, Ru, and Ni as a main component, or a black material including tricobalt tetraoxide ($CO_3O_4$), ruthenium oxide, or lanthanum composite oxide may be added.

The photosensitive conductive composition according to this embodiment of the present invention may be produced by mixing the above-described components and any desired components at a predetermined ratio, and then uniformly dispersing the resultant mixture by a kneader such as a three-roll mill and a blender.

The photosensitive conductive composition of the present embodiment is formed into a conductor pattern on a substrate, for example, through the following steps described by referring to FIGS. 1 and 2A–2D.

Figure 2A:
FIGS. 2A–2D are schematic illustrations showing a process of forming a conductor pattern by using the photosensitive conductive composition.

(1) First, as illustrated in FIG. 2A, a photosensitive conductive composition 21 of the present embodiment is provided on the glass substrate 1 used as, for example, a front substrate of a plasma display panel (PDP) as shown in FIG. 1, by an appropriate coating method such as a screen printing method, a bar coater, or a blade coater, and then the resultant coating is dried for achieving finger-touch at about 60° C. to 120° C. for 5 minutes to 40 minutes in a hot-air circulating type drier or a far infrared drying furnace to evaporate the organic solvent and produce a tack-free film.

In this step, the substrate is not particularly limited, but a heat-resistant substrate such as a glass substrate or a ceramic substrate may be used.

Alternatively, a paste may be previously formed into a film, and in this case, the film may be laminated on the substrate.

Figure 2B:
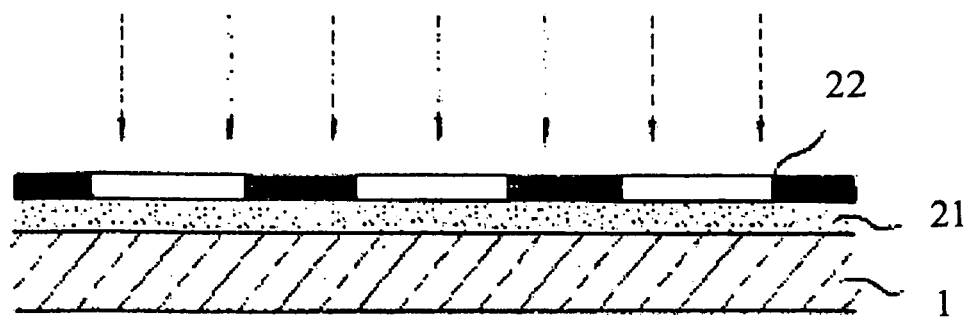
Figure 2C:
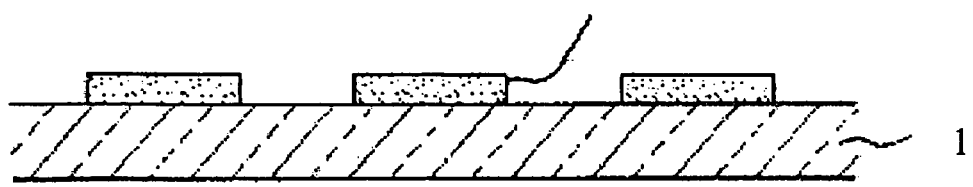

(2) Next, the dried film made of the photosensitive conductive composition 21 formed on the substrate is subjected to pattern exposure and development to form a patterned composition 23 as shown in FIG. 2C.

In the exposure step, contact exposure or non-contact exposure may be performed using a negative mask 22 having a predetermined exposure pattern as shown in FIG. 2B. As an exposure light source, a halogen lamp, a high-pressure mercury lamp, a laser light, a metal halide lamp, a black lamp, or an electrodeless lamp is used. The exposure is preferably about 50 to 1000 $mJ/cm^2$.

The development step may be performed by a spray method or a dipping method. An alkali metal aqueous solution of sodium hydroxide, potassium hydroxide, sodium carbonate, potassium carbonate, or sodium silicate, an aqueous amine solution of monoethanolamine, diethanolamine, or triethanolamine is used as a developer. Particularly, a diluted aqueous alkali solution of a concentration of about 1.5% by weight or less is preferably used. However, the developer is not limited to the above-described developers as long as the carboxyl groups of the carboxyl-containing resin in the composition are saponified to remove an uncured portion (unexposed portion). In order to remove the unnecessary developer remaining after development, water washing and acid neutralization are preferably performed.

Figure 2D:
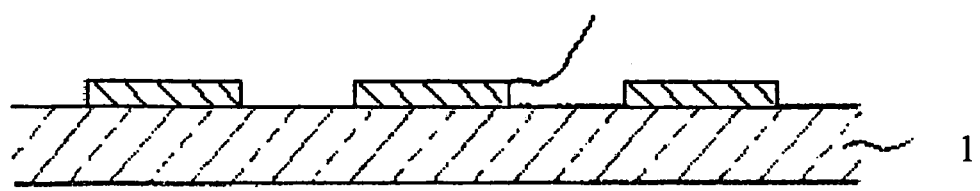

(3) Then, the resultant patterned composition made of the photosensitive conductive composition 21 is fired to remove the organic components contained in the photosensitive conductive composition 21 and form a predetermined patterned conductor 24 as shown in FIG. 2D.

Examples of the photosensitive conductive composition according to the above embodiment of the present invention are provided below. In the following descriptions, "parts" means "parts by weight" unless otherwise specified.

The organic binder, the silver powder, and the lead-free glass powder described below were used. The components including these components were mixed at a predetermined ratio, and the resultant mixture was stirred by a stirrer and then ground by a three-roll mill to form a paste. As a result, a photosensitive conductive paste (Composition Example 1) was prepared as an example of the present embodiment. The components of (Composition Example 1) are as follows:

| | |
|---|---|
| Organic binder A | 100.0 parts |
| Trimethylolpropane triacrylate | 25.0 parts |
| EO modified trimethylolpropane triacrylate | 25.0 parts |
| 2-benzyl-2-dimethylamino-1-(4-morpholinophenyl)-butanone-1 | 10.0 parts |
| 2,4-diethylthioxanthone | 1.0 part |
| Tripropylene glycol monomethyl ether | 90.0 parts |
| Silver powder A | 500.0 parts |
| Glass powder C | 25.0 parts |
| Phosphoric acid ester | 1.0 part |
| Defoaming agent (BYK·354: produced by BYK Chemie Japan K.K.) | 1.0 part |

Photosensitive conductive pastes of Composition Examples 2 to 4 (examples of the present embodiment) and Comparative Composition Examples 1 to 4 were prepared by the same method as that used for Composition Example 1 except that the silver powder and/or the glass powder was changed to the material shown in Tables 1 and 2.

Organic Binder

Methyl methacrylate and methacrylic acid were mixed at a molar ratio of 0.87:0.13 in a flask provided with a thermometer, a stirrer, a dropping funnel, and a reflux condenser, and then dipropylene glycol monomethyl ether as a solvent and azobisisobutyronitrile as a catalyst were added in the flask. Then, the resultant mixture was stirred at 80° C. for 2 to 6 hours in a nitrogen atmosphere to produce a resin solution. Organic binder A (copolymer resin) in the resin solution had a weight-average molecular weight of about 10,000 and an acid value of 74 mgKOH/g.

The weight-average molecular weight of the resultant organic binder A was measured by high-performance liquid chromatography using a pump, LC-6AD, produced by Shimazu Corporation and three columns of Shodex (trademark) KF-804, KF-803, and KF-802 produced by Showa Denko K.K.

Silver Powder

Silver powders A, B, and C each having the half width, the average particle size, and the specific surface area shown in Table 1 were used. Each of the silver powders was produced as follows:

Silver Powder A

First, 350 mL of industrial ammonia was added to 5 L of a 20 g/L silver nitrate aqueous solution containing silver ions to prepare a silver amine complex solution. The resultant solution was diluted with 5 L of pure water, 32 mL of a 80% hydrazine solution was added to the resultant mixture, and immediately after that, 0.43 g of oleic acid was added to the mixture. Then, the resultant silver slurry was washed with water and dried to prepare silver powder A.

Silver Powder B

First, 40 mL of a 100 g/L sodium hydroxide solution was added to 5 L of a 20 g/L silver nitrate aqueous solution containing silver ions to control pH, and then 450 mL of industrial ammonia was added to the resultant mixture to prepare a silver amine complex solution. Furthermore, 40 mL of a 100 g/L sodium hydroxide solution was added to the solution to control pH, and the resultant solution was diluted with 5 L of pure water. Then, 500 mL of industrial formalin functioning as a reducer was added to the solution, and immediately after that, 0.43 g of oleic acid was added to the mixture. Subsequently, the resultant silver slurry was washed with water and dried to prepare silver powder B.

Silver Powder C

A silver nitrate aqueous solution (corresponding to 38 g of silver) and an ammonia aqueous solution (corresponding to 34 g of ammonia) were added to 3300 g of pure water under stirring. After stirring for 15 minutes, 5 g of ammonium nitrate and 50 mL (content of sodium stearate: 500 ppm/Ag) of sodium stearate water were added to the resultant mixture. Then, a hydrogen peroxide aqueous solution (3.3 mol/L) and a sodium hydroxide aqueous solution (0.8 mol/L) were simultaneously added at a rate of 100 mL/min for 240 seconds. Then, the resultant silver slurry was washed with water and dried to prepare silver powder C.

In addition, #11000-02, #11000-04, and #11000-06 produced by FERRO JAPAN Co., Ltd. were used as Silver Powders D, E, and F, respectively.

TABLE 1

| | Half width (°) of Ag(111) peak in X-ray diffraction pattern | Average particle size (μm) | Specific surface area (m$^2$/g) |
|---|---|---|---|
| Silver powder A | 0.4461 | 1.1 | 0.45 |
| Silver powder B | 0.2480 | 1.2 | 0.43 |
| Silver powder C | 0.1354 | 1.2 | 0.42 |
| Silver powder D | 0.13 | 3.6 | 0.27 |
| Silver powder E | 0.14 | 1.0 | 0.4 |
| Silver powder F | 0.13 | 0.82 | 0.7 |

TABLE 2

| Name | Glass A (alkali glass) | | Glass B (phosphorus-based glass) | | Glass C (bismuth-based glass) | |
|---|---|---|---|---|---|---|
| Composition ratio (parts by weight) | Li$_2$O | 10 | P$_2$O$_5$ | 65 | Bi$_2$O$_3$ | 50 |
| | Na$_2$O | 10.2 | Na$_2$O | 3.4 | B$_2$O$_3$ | 16 |
| | K$_2$O | 7.5 | BaO | 9.7 | ZnO | 14 |
| | BaO | 6.7 | Al$_2$O$_3$ | 6.4 | SiO$_2$ | 2 |
| | Al$_2$O$_3$ | 6.8 | ZnO | 15.5 | BaO | 18 |
| | SiO$_2$ | 58.8 | — | | — | |
| | Total | 100 | Total | 100 | Total | 100 |
| Glass transition point Tg/° C. | 442 | | 451 | | 443 | |
| Softening point Sp/° C. | 548 | | 534 | | 501 | |
| Thermal expansion coefficient/×10$^{-7}$ ° C. | 109 | | 76 | | 86 | |

As for the lead-free glass powder (E), glass (A), (B) or (C) shown in Table 2 was used.

The resultant photosensitive conductive paste of each of Composition Examples 1 to 4 and Comparative Composition Examples 1 to 4 were evaluated with respect to resolution, resistivity, adhesion, and firing shrinkage. The evaluation was performed by the following methods:

Preparation of Test Piece:

Each photosensitive conductive paste for evaluation was coated over the entire surface of a glass substrate by a 180 mesh polyester screen, and then dried in a hot-air circulating drying furnace at 90° C. for 20 minutes to form a coated film having good finger-tough dryness. Next, pattern exposure was preformed by a metal halide lamp as a light source through a negative mask so that the integrated exposure on the dry film was 300 mJ/cm². Then, development was performed with a Na₂CO₃ aqueous solution of 0.5% by weight at a liquid temperature of 30° C., followed by washing with water. The substrate on which the film pattern was formed as described above was heated to 550° C. at a rate of 5° C./min in an air atmosphere, and fired at 570° C. for 30 minutes to form a test piece having a conductor pattern formed thereon.

(Resolution):

The minimum line width of the test piece prepared by the above-described method was evaluated.

(Resistivity):

A test piece having a pattern of 4 mm×10 cm formed thereon was prepared by the above-described method, and the resistance and thickness of the pattern were measured to calculate resistivity.

(Adhesion):

The test piece prepared by the above-described method was subjected to an adhesive tape peeling test to evaluate whether or not peeling of the pattern occurred. In Table 3, ○ indicates that there was no peel-off of the pattern.

(Firing Shrinkage (Width and Thickness))

In forming the conductor pattern by the above-described method, the width and thickness of a line having a mask width of 100 μm were measured after development and after firing to calculate a shrinkage ratio (%).

The evaluation results are shown in Table 3.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A photosensitive conductive composition comprising:
    a silver powder having an X-ray diffraction pattern in which a half width of a silver (111) peak is at least about 0.15°;
    an organic binder;
    a photopolymerizable monomer;
    a photopolymerization initiator; and
    a lead-free glass.

2. A photosensitive conductive composition according to claim 1, wherein the half width of the silver (111) peak is in a range of from about 0.15° to about 1°.

3. A photosensitive conductive composition according to claim 1, wherein the silver powder is contained in an amount of from about 50 parts by weight to about 90 parts by weight in 100 parts of the photosensitive conductive composition by weight.

4. A photosensitive conductive composition according to claim 1, wherein the lead-free glass includes at least one alkali material selected from the group consisting of $Li_2O$, $Na_2O$, $K_2O$, CaO, BaO and MgO.

5. A photosensitive conductive composition according to claim 4, wherein the lead-free glass includes the at least one

TABLE 3

|  | Composition Example 1 | Composition Example 2 | Composition Example 3 | Composition Example 4 | Comparative Composition Example 1 | Comparative Composition Example 2 | Comparative Composition Example 3 | Comparative Composition Example 4 |
|---|---|---|---|---|---|---|---|---|
| Silver powder | Silver powder A | Silver powder B | Silver powder B | Silver powder B | Silver powder C | Silver powder D | Silver powder E | Silver powder F |
| Glass powder | Glass C | Glass C | Glass A | Glass B | Glass C | Glass C | Glass C | Glass C |
| Resolution/μm | 10 | 10 | 10 | 10 | 10 | 10 | 10 | 10 |
| Resistivity/ ×10⁻⁶ Ω · cm | 2.4 | 2.5 | 2.7 | 2.6 | 4.3 | 8.3 | 4.8 | 4.4 |
| Adhesion | ○ | ○ | ○ | ○ | ○ | ○ | ○ | ○ |
| Firing shrinkage (width)/% | −16 | −15 | −16 | −16 | −15 | −12 | −12 | −15 |
| Firing shrinkage (thickness)/% | −74 | −74 | −73 | −74 | −70 | −55 | −60 | −70 |

The results shown in Table 3 indicate that the photosensitive conductive composition according to the present embodiment produces a patterned conductor having excellent conductivity and resolution and excellent adhesion to a substrate.

As described above, the photosensitive conductive composition according to the embodiment of the present invention is excellent both in formability of a conductor with a high-definition pattern and firing property at a temperature of 620° C. or less. As a result, a patterned conductor exhibiting excellent conductivity and resolution are easily formed even by firing at a temperature of 620° C. or less without performing a complicated step. Also, in the present embodiment, a lead-free glass powder not containing Pb is used, thereby permitting improvement in a working environment and the prevention of lead contamination due to waste.

alkali material in an amount of from about 5% to about 50% of the lead-free glass by weight.

6. A photosensitive conductive composition according to claim 1, wherein the lead-free glass includes a phosphorous-containing material.

7. A photosensitive conductive composition according to claim 1, wherein the lead-free glass includes $P_2O_5$.

8. A photosensitive conductive composition according to claim 1, wherein the lead-free glass includes $P_2O_5$ in an amount of from about 30% to about 80% of the lead-free glass by weight.

9. A photosensitive conductive composition according to claim 1, wherein the lead-free glass includes a bismuth-containing material.

10. A photosensitive conductive composition according to claim 1, wherein the lead-free glass includes $Bi_2O_3$.

11. A photosensitive conductive composition according to claim 1, wherein the lead-free glass includes $Bi_2O_3$ in an amount of from about 30% to about 80% of the lead-free glass by weight.

12. A photosensitive conductive composition according to claim 1, wherein the organic binder comprises a compound having a carboxyl group.

13. A photosensitive conductive composition comprising:
a silver powder having sufficient crystallinity such that the silver powder is sintered when fired at a temperature of about 620° C. or less;
an organic binder;
a photopolymerizable monomer;
a photopolymerization initiator; and
a lead-free glass.

14. A conductor comprising a fired material, wherein the fired material is formed by firing a photosensitive conductive composition including a silver powder having an X-ray diffraction pattern in which a half width of a silver (111) peak is at least about 0.15°, an organic binder, a photopolymerizable monomer, a photopolymerization initiator, and a lead-free glass.

15. A plasma display panel comprising a patterned conductor formed by firing a photosensitive conductive composition, wherein the photosensitive conductive composition includes a silver powder having an X-ray diffraction pattern in which a half width of a silver (111) peak is at least about 0.15°, an organic binder, a photopolymerizable monomer, a photopolymerization initiator, and a lead-free glass.

16. A method of forming a patterned conductor on a substrate, comprising:
providing on a substrate a photosensitive conductive composition including a silver powder having an X-ray diffraction pattern in which a half width of a silver (111) peak is at least about 0.15°, an organic binder, a photopolymerizable monomer, a photopolymerization initiator, and a lead-free glass;
subjecting the photosensitive conductive composition to a patterned exposure of light;
developing the photosensitive conductive composition to form a patterned composition; and
firing the patterned composition at a predetermined temperature.

17. A method of forming a patterned conductor on a substrate according to claim 16, wherein the predetermined temperature is about 620° C. or less.

18. A method of forming a patterned conductor on a substrate according to claim 16, wherein the predetermined temperature is in a range of from about 480° C. to about 620° C.

19. A plasma display panel comprising a patterned conductor produced by a process including:
providing on a substrate a photosensitive conductive composition including a silver powder having an X-ray diffraction pattern in which a half width of a silver (111) peak is at least about 0.15°, an organic binder, a photopolymerizable monomer, a photopolymerization initiator, and a lead-free glass;
subjecting the photosensitive conductive composition to a patterned exposure of light;
developing the photosensitive conductive composition to form a patterned composition; and
firing the patterned composition.

* * * * *